United States Patent
LaFerrara et al.

[11] Patent Number: 6,104,246
[45] Date of Patent: Aug. 15, 2000

[54] VARIABLE GAIN RF AMPLIFIER WITH SWITCHABLE BIAS INJECTION AND FEEDBACK

[75] Inventors: Holly A. LaFerrara, Wappingers Falls, N.Y.; Nathaniel King, Bethel, Conn.

[73] Assignee: International Business Machines Corporation, Armonk, N.Y.

[21] Appl. No.: 09/318,145

[22] Filed: May 25, 1999

[51] Int. Cl.[7] .............................. H03G 3/12; H03G 3/30
[52] U.S. Cl. ..................... 330/282; 330/285; 330/296
[58] Field of Search ................................ 330/282, 285, 330/296, 302

[56] References Cited

U.S. PATENT DOCUMENTS

| | | |
|---|---|---|
| 3,378,781 | 4/1968 | Hill . |
| 3,794,931 | 2/1974 | Albrecht et al. . |
| 3,955,151 | 5/1976 | Ochiai . |
| 4,099,134 | 7/1978 | Schroder . |
| 4,210,873 | 7/1980 | Suzuki et al. . |
| 5,083,096 | 1/1992 | Miyazaki ............................ 330/285 |
| 5,278,517 | 1/1994 | Fujita .................................. 330/285 |
| 5,412,346 | 5/1995 | Burger, Jr. et al. . |
| 5,525,929 | 6/1996 | Nagahori et al. . |
| 5,530,402 | 6/1996 | Wright . |
| 5,602,510 | 2/1997 | Bayruns et al. . |
| 5,661,437 | 8/1997 | Nishikawa et al. ................. 330/282 |
| 5,874,860 | 2/1999 | Brunel et al. ....................... 330/285 |
| 5,973,566 | 10/1999 | Leiby ................................. 330/282 |

*Primary Examiner*—Michael B Shingleton
*Attorney, Agent, or Firm*—Ratner & Prestia

[57] ABSTRACT

A RF integrated circuit including an amplifier having an input node and an output node; a switchable feedback path coupled between the output node and input node; and a switchable bias injector coupled to the input node. When the switchable feedback path is off and the switchable bias injector is on, the amplifier is in a high gain state. When the switchable feedback path is on and the switchable bias injector is off, the amplifier is in a low gain state. The circuit may be used in up converters and down converters for CDMA systems.

20 Claims, 5 Drawing Sheets

6,104,246

VARIABLE GAIN RF AMPLIFIER WITH SWITCHABLE BIAS INJECTION AND FEEDBACK

TECHNICAL FIELD

The present invention relates, in general, to a radio frequency (RF) amplifier incorporated on an integrated circuit (IC) and, more specifically, to an RFIC amplifier that may be switched between two operating states having different gain control.

BACKGROUND OF THE INVENTION

Variable gain signal amplifiers are used by the communications industry in a variety of products, such as up converters and down converters for Code Division Multiple Access (CDMA) systems. It is well known that, in handling RF signals, signal radiation within the amplifying circuit may occur and cause uncontrolled feedback that prevents the circuit from operating. Accordingly, feedback in an amplifier needs to be controlled. Furthermore, as the gain of the amplifier is varied to respond to differing frequency characteristics of the input signals, controlled feedback may be used to provide a signal output that is uniform over a wide frequency band.

It is known to use an amplifier with a gain that can be switched between two operating states. The operating state of the amplifier determines how much gain or attenuation may be inserted between the input signal and the output signal of the amplifier. The operating state of the amplifier may be varied by controlling the impedance in the feedback path of the amplifier. Such an amplifier is taught by Schroder in U.S. Pat. No. 4,099,134, issued Jul. 4, 1978.

As shown in FIG. 1, Schroder teaches an amplifying circuit with a gain switched between two states using two mutually coupled switches 7 and 13. Switches 7 and 13 are formed by a single, double-pole, double-throw switch. An input signal at terminal 1 is fed to non-inverting input 2 of differential amplifier 4. The output 5 of differential amplifier 4 is connected via contact 6 of switch 7 to output terminal 9.

Output 5 of amplifier 4 is connected through a series connection of a first impedance 14 and a second impedance 18 to a ground reference potential. The first impedance 14 has an impedance value that is variable through a control voltage applied at terminal 16. Connecting point 17 between the two impedances 14 and 18 is connected, via contact 12 of switch 13, with inverting input 3 of amplifier 4. In this way, impedances 14 and 18 form a negative feedback path for amplifier 4, which is controlled by a voltage at terminal 16.

In the illustrated position of switches 7 and 13, an increase of the impedance value of first impedance 14 results in an increase in the gain of amplifier 4. If the circuit shown is switched to its other possible operation state by actuation of the mutually coupled switches 7 and 13, then a feedback path is formed from output 5 via a d.c. path 10 and contact 11 to inverting input 3 of amplifier 4. In this condition, the amplifier 4 has a gain of approximately one. Thus, the signal at output 5 is the same as the non-inverting input 2 of the amplifier 4. The circuit acts as if output 5 is electrically connected to input terminal 1.

Another amplifier circuit is disclosed in U.S. Pat. No. 5,530,402 (issued to Wright) and illustrated in FIG. 2 as sequential amplifier circuit 20. In FIG. 2, the circuit 20 includes a signal input line 22 ("IN") coupled to the amplifier 23 via a first switch 25. The output signal from amplifier 23 is gated to the input of a two-port delay line 26 ("D.L.") via a second switch 27. A switch controller 21 ("SWITCH") controls the movable arms of first and second switches 25 and 27. As the signal emerges from delay line 26, switch controller 21 causes the movable arm of first and second switches 25 and 27 to respectively move to the other position. Consequently, the emerging signal from delay line 26 enters amplifier 23 and is again amplified and exits circuit 20 through an output line 24 ("OUT"). Thus, amplifying circuit 20 provides double amplification. In the first state of switch controller 21, a first amplification is provided and the signal is passed through a delay line. In the second state of switch controller 21, a second amplification is provided as the signal emerges from the delay line.

The amplifier circuits shown in FIGS. 1 and 2 work well for the purposes disclosed. Nevertheless, implementation of these circuits has proven inefficient. Some portions of the amplifier circuits are typically implemented on a chip, while other portions are implemented off-chip. For example, the differential amplifier and the delay line discussed above are typically implemented on the chip and may be densely packaged. The switches are implemented off-chip, however, separated from the amplifier or the delay line, and cannot be densely packaged as an integral unit.

The deficiencies of the conventional RFIC amplifiers show that a need still exists for an improved device. To overcome the shortcomings of the conventional devices, a new RFIC amplifier is provided. An object of the present invention is control the amount of gain provided by the amplifier, while also shaping the gain and return losses of the amplifier. A related object is to shape the gain and return losses of the amplifier so that signal reflection is avoided at the input side, as well as the output side, of the amplifier.

Yet another object of the present invention is to provide a gain-controlled amplifier circuit that may be fabricated almost entirely on-chip (on the substrate) and without the need for negative voltage. Another object is to provide a circuit that may be more densely packaged as compared to conventional amplifiers with switches implemented off-chip. A related object is to provide a configuration that yields packages that are smaller in size and have lower cost than conventional packages.

Still another object of the present invention is to provide a gain-controlled amplifier circuit that may be used as an effective gain control for RFIC amplifiers in up converters and down converters used in CDMA systems. A related object is to provide a circuit that may also be used as an effective gain control for any low noise RF amplifier or any amplifier requiring a high gain mode and a low gain standby mode.

SUMMARY OF THE INVENTION

To achieve these and other objects, and in view of its purposes, the present invention provides an RF integrated circuit. The circuit includes an amplifier having an input node and an output node; a switchable feedback path coupled between the output node and the input node; and a switchable bias injector coupled to the input node. When the switchable feedback path is off and the switchable bias injector is on, the amplifier is in a high gain state. When the switchable feedback path is on and the switchable bias injector is off, the amplifier is in a low gain state. The switchable feedback path includes a capacitor, a resistor, and a transistor connected in series between the input node and the output node. The transistor has a control gate for switching the switchable feedback path on and off. The switchable bias injector includes another transistor coupled between a voltage reference and the input node. The second transistor also has a control gate for switching the switchable bias injector on and off.

The RF integrated circuit includes an input matching network and an output matching network at the amplifier input and output, respectively. The amplifier circuit also includes a $V_{cc}$ bias injector coupled to a collector of the amplifier for injecting a voltage level at the collector.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
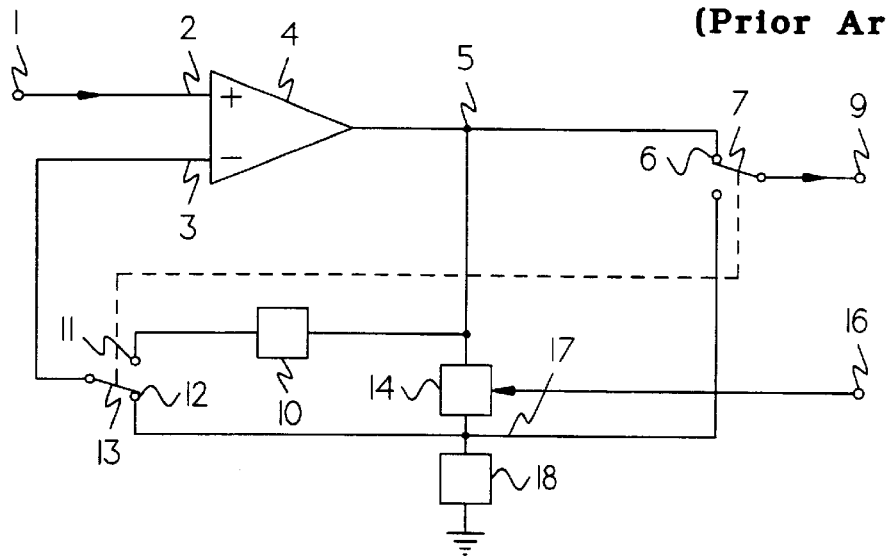
FIG. 1 represents a conventional RF amplifier with multiple switches for controlling gain.
Figure 2:
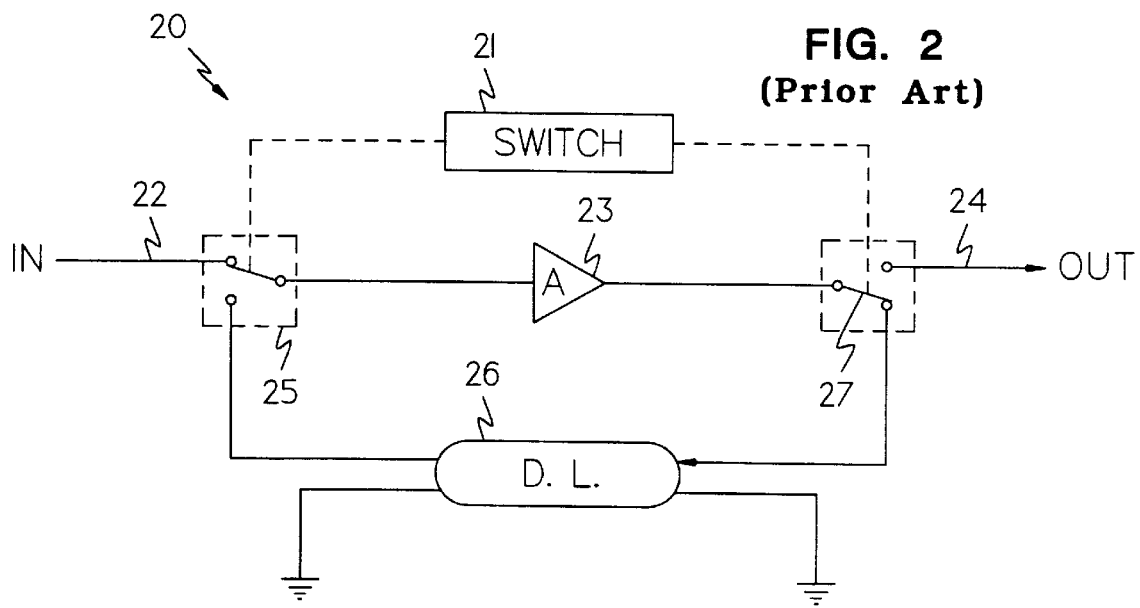
FIG. 2 represents another conventional RF amplifier with multiple switches for controlling gain between an input terminal and an output terminal.
Figure 3:
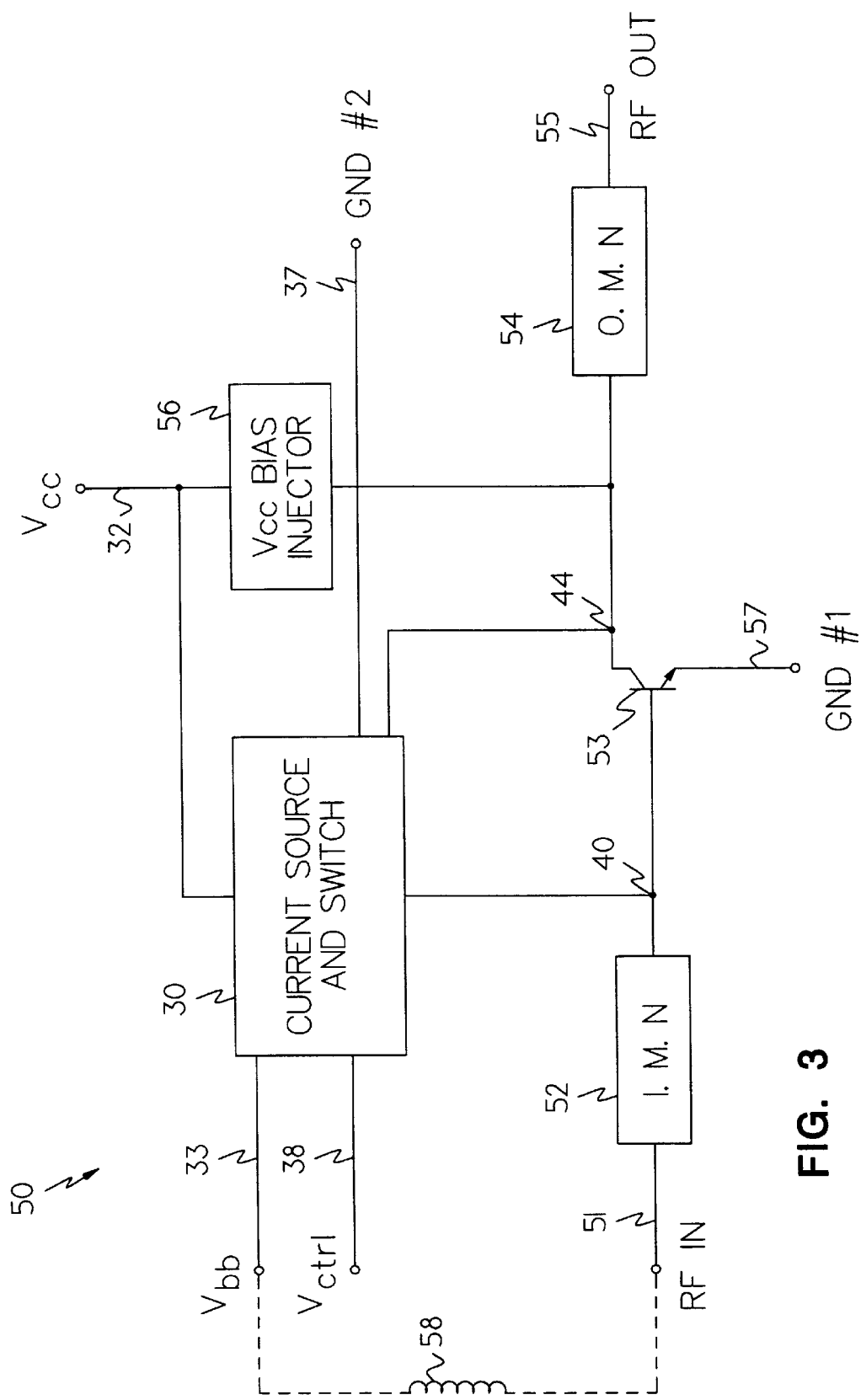
FIG. 3 is a circuit diagram of the present invention illustrating how a current source and switch are connected to an RF amplifier.
Figure 4:
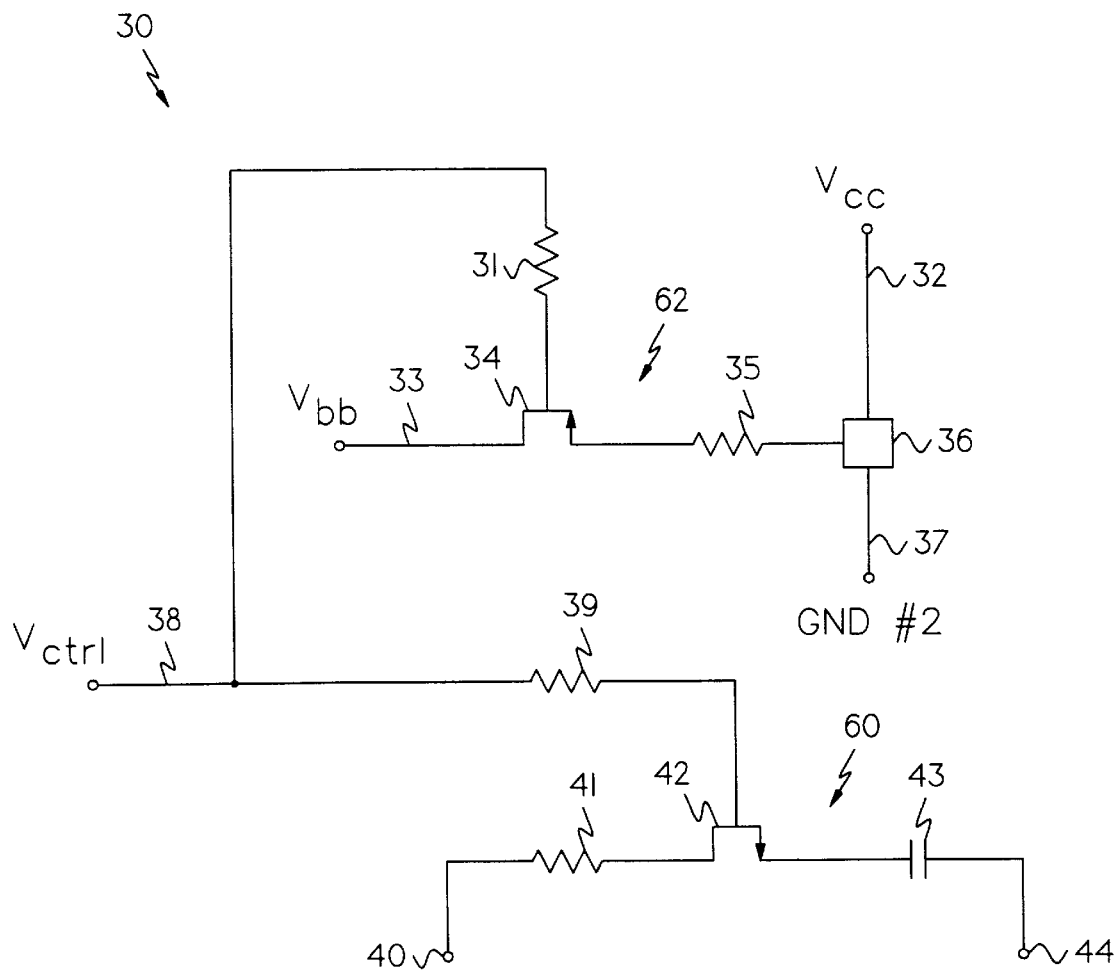
FIG. 4 is a circuit diagram of the current source and switch of FIG. 3.

FIGS. 3 and 4 are illustrations of a circuit of the present invention, in which a switch is positioned in the feedback path of an amplifier. In the high gain state of the amplifier, the switch is off and only light feedback is supplied to the amplifier. In the low gain state, the switch is on. When the switch is on, two functions are provided. The first function reduces the gain of the amplifier, by supplying heavy feedback to the amplifier. The second function shuts off the amplifier current, thereby reducing the circuit to a passive transmission line. The switch also shapes the gain and return losses of the amplifier so that signal reflection is avoided.

As shown in FIG. 3, gain controlled amplifier circuit 50 includes a radio frequency integrated circuit (RFIC) amplifier 53 having an input matching network 52 ("I.M.N.") coupled between an RF input terminal 51 ("RF IN") and the base 40 of amplifier 53. Input matching network 52 is effective in matching the impedance seen by an RF input signal as it propagates toward the base 40 of amplifier 53. Input matching network 52 may include a combination of resistive, capacitive, and inductive elements, conventionally formed on a substrate. Similarly, output matching network 54 ("O.M.N.") is coupled between the collector 44 of amplifier 53 and an RF output terminal 55 ("RF OUT"). Output matching network 53 provides maximum power transfer from the output of amplifier 53 to RF output terminal 55. Completing the connection of amplifier 53, emitter 57 of the amplifier 53 is connected to an RF ground potential at the GND #1 terminal shown in FIG. 3.

Coupled across amplifier 53, between collector 44 and base 40, is current source and switch 30. As will be explained, current source and switch 30 controls the amount of feedback between the output and input of amplifier 53. The control characteristics of current source and switch 30 depend on a control voltage, $V_{ctrl}$, provided as input at the terminal 38.

Current source and switch 30 also controls the amount of bias voltage injected into the base of amplifier 53. The bias voltage is shown as $V_{bb}$ in FIG. 3 and is provided as output at the terminal 33. $V_{bb}$ is routed through an external coil 58 to RF input terminal 51, where it injects a dc bias voltage into the base 40 of amplifier 53. Separate from current source and switch 30 is $V_{cc}$ bias injector 56, which controls the voltage at collector 44 of amplifier 53. $V_{cc}$ bias injector 56 may be, for example, a resistive network for providing a dc voltage reference to the collector 44 of amplifier 53. Providing the source of voltage is a conventional $V_{cc}$ voltage reference at the terminal 32.

Current source and switch 30 is shown in greater detail in FIG. 4. As will be explained, current source and switch 30 provides a switchable feedback path, denoted generally as 60, and a switchable bias injector, denoted generally as 62. As shown, $V_{ctrl}$, provided as an input voltage at terminal 38, simultaneously controls the states of p-type field effect transistor 34 ("PFET") and n-type field effect transistor 42 ("NFET") by way of gate resistor 31 and gate resistor 39, respectively. When $V_{ctrl}$ is set at 3 volts, for example, PFET 34 is turned off and NFET 42 is turned on. Conversely, when $V_{ctrl}$ is set at 0 volts, for example, PFET 34 is turned on and NFET 42 is turned off.

An FET has a control gate and source and drain regions formed in a substrate. The control gate is formed above a dielectric insulator that is deposited over the area between the source and drain regions. As voltage is applied to the control gate, mobile charged particles in the substrate form a conduction channel in the region between the source and drain regions. Once the channel forms, the transistor turns "on" and current may flow between the source and drain regions.

The switchable bias injector 62 will now be explained. When PFET 34 is on, $V_{bb}$ is applied to the base 40 of amplifier 53. The voltage reference for $V_{bb}$ may be obtained, for example, from voltage divider network 36 by way of resistor 35. It will be appreciated that voltage divider network 36 may be an operational amplifier or a resistive network coupled between, for example, a positive voltage reference, $V_{cc}$, at terminal 32 and a dc ground reference, GND #2, at the terminal 37 (see FIGS. 3 and 4). When PFET 34 is off, bias voltage $V_{bb}$ is not applied to the base 40 of amplifier 53.

The switchable feedback path 60 will now be explained. When NFET 42 is on, a feedback path is created between the output of amplifier 53 at collector 44 and the input to amplifier 53 at base 40. As shown in FIG. 4, the feedback path includes a resistor 41 and a capacitor 43, respectively connected to the drain and source of NFET 42. Although not shown in the figure, it will be appreciated that resistor 41 may be replaced with a capacitor. When NFET 42 is off, the feedback path is essentially not seen by amplifier 53.

In operation, circuit 50 has two states—a high gain state and a low gain state. In the high gain state, $V_{ctrl}$ is set to 0 volts, for example. With $V_{ctrl}$ set to 0 volts, NFET 42 is off and, consequently, feedback across amplifier 53 is essentially eliminated. In addition, with $V_{ctrl}$ set to 0 volts, PFET transistor 34 is on and, consequently, the base bias voltage, $V_{bb}$, is injected, into the base 40 of amplifier 53, by way of external inductor 58. With $V_{bb}$ biasing the base 40 of amplifier 53 and with essentially no feedback from the collector 44 to the base 40 of amplifier 53, amplifier 53 provides high gain to the RF signal input at terminal 51.

In the low gain state, $V_{ctrl}$ is set to 3 volts, for example. With $V_{ctrl}$ set to 3 volts, NFET 42 is on and, consequently, a feedback path is provided across amplifier 53. In addition, with $V_{ctrl}$ set to 3 volts, PFET 34 is off and, consequently, the bias voltage is not injected into the base 40 of amplifier 53. With the feedback path closed and without $V_{bb}$ bias, amplifier 53 is in a low gain state (actually has a loss). Effectively, the signal path between terminal 51 (RF IN) and terminal 55 (RF OUT) is reduced to a passive transmission line network.

Figure 5:
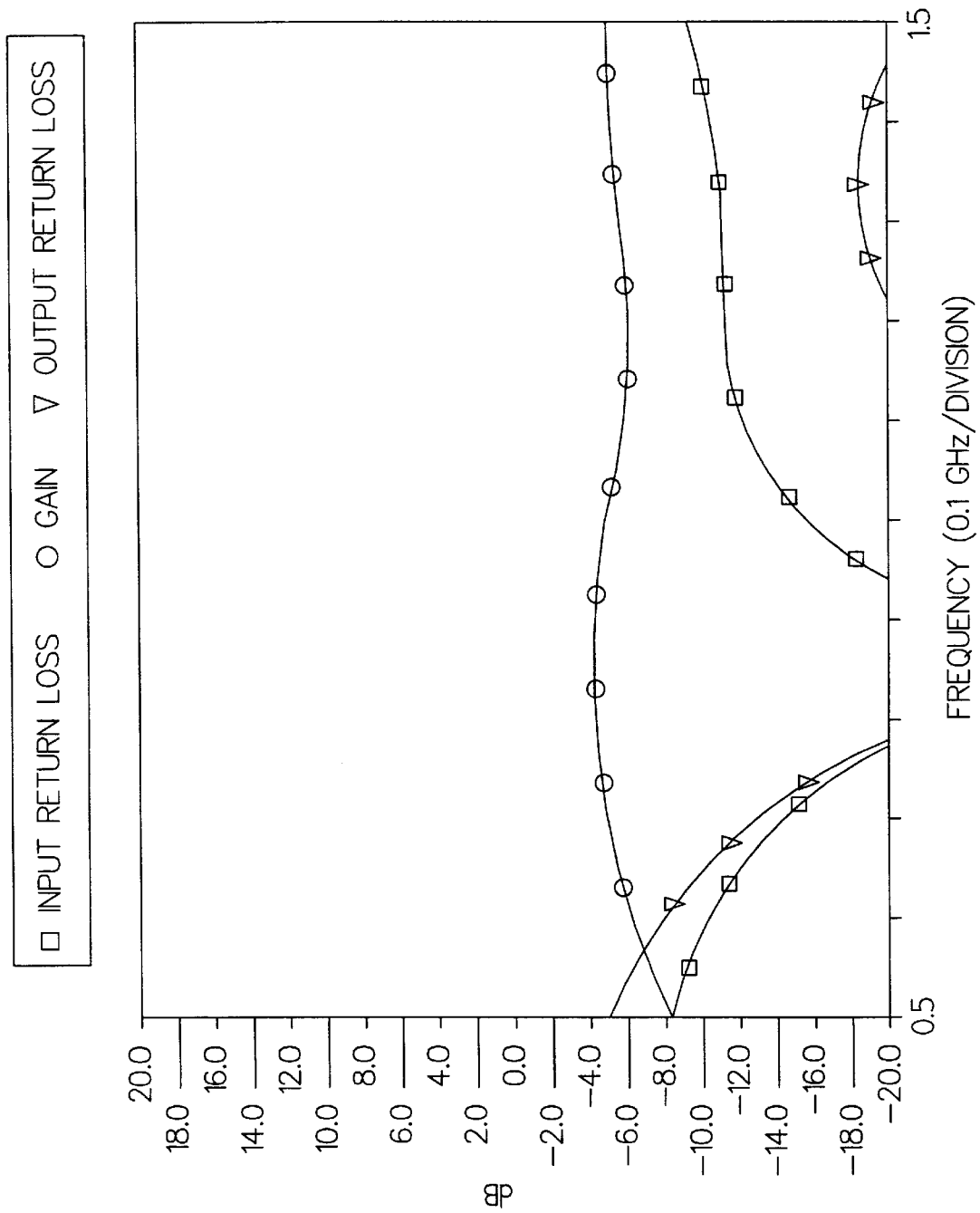
FIG. 5 is a plot of gain in dB versus frequency in GHz of the present invention during a high gain state of the RF amplifier.

Current source and switch 30 not only controls the amount of gain provided by amplifier 53, it also shapes the gain and return losses of the amplifier 53. This result may be seen by examining FIGS. 5 and 6, which are plots of the amplifier gain in dB versus frequency in GHz. The low gain state is shown in FIG. 5. As shown, the amplifier 53 behaves like a passive transmission line and has a loss that fluctuates between −4 dB and −8 dB over the frequency band. Note also that the circuit 50 suppresses reflection at the input side of the amplifier 53, as well as the output side of the amplifier 53.

Figure 6:
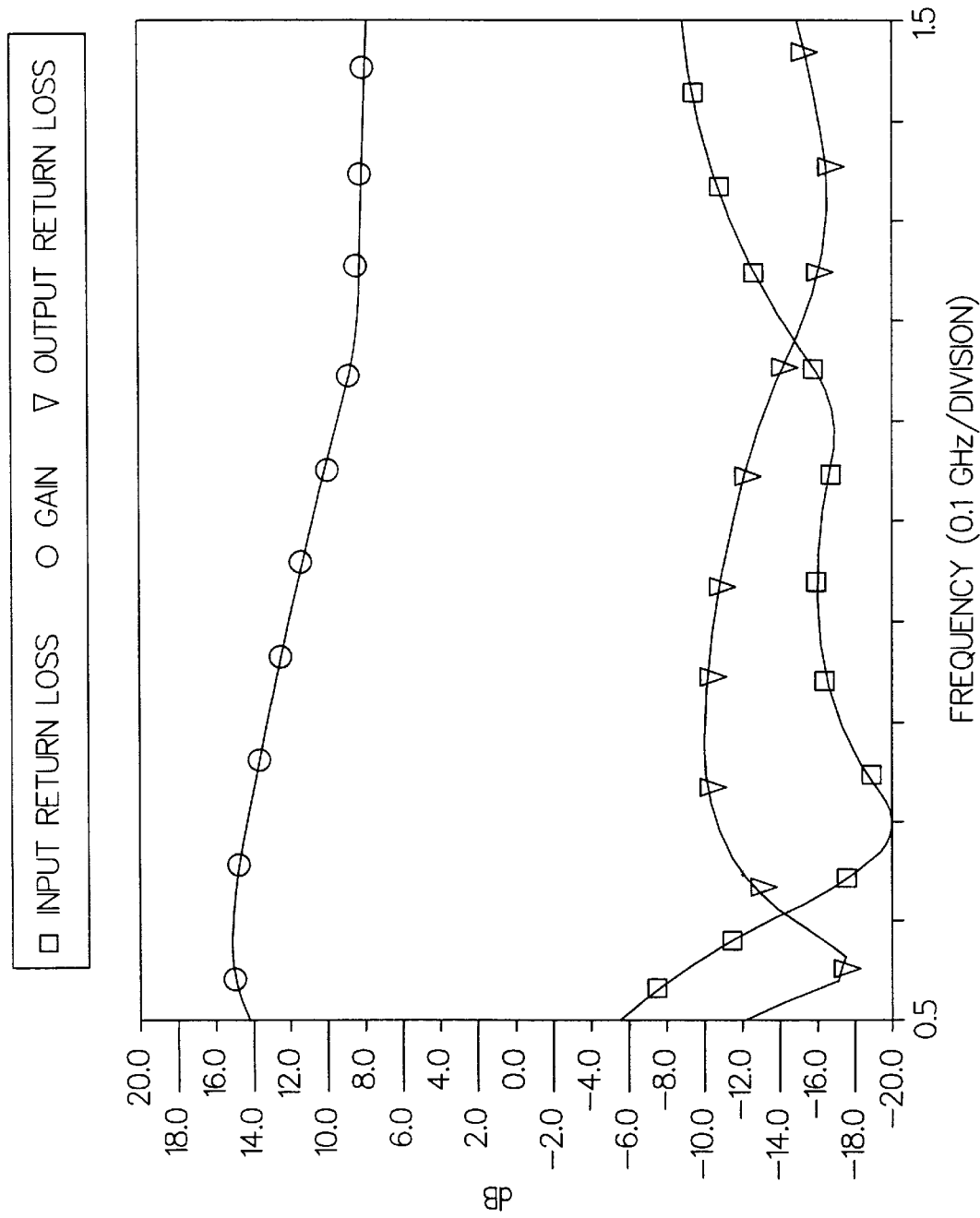
FIG. 6 is a plot of gain in dB versus frequency in GHz of the present invention during a low gain state of the RF amplifier.

The high gain state is shown in FIG. 6. As shown, the amplifier 53 has a sizable gain over the frequency band. The gain fluctuates between 8 dB and 15 dB over a frequency band between 0.5 and 1.5 GHz. Note also that the circuit 50 reduces reflection losses at the input side, as well as the output side, of the amplifier 53.

It will be appreciated that gain controlled amplifier circuit 50, shown in FIG. 3, may be fabricated entirely on-chip (on the substrate), except for external inductor 58 which is fabricated off-chip. By using the SiGe BiCMOS (Silicon Germanium Bipolar Complementary Metal Oxide Semiconductor) process, the switching may be done entirely on-chip without the need for negative voltage. Circuit 50 may also be more densely packaged as compared to conventional GaAs (Gallium Arsenic) amplifiers with switches implemented off-chip. This configuration yields packages that are smaller in size and have lower cost.

It will also be appreciated that gain controlled amplifier circuit 50 may be used as an effective gain control for RFIC amplifiers in up converters and down converters used in CDMA systems. Circuit 50 may also be used as an effective gain control for any low noise RF amplifier or any amplifier requiring a high gain mode and a low gain standby mode.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A gain controlled amplifier circuit comprising:
an amplifier having an input node and an output node;
a switchable feedback path coupled between said output node and said input node; and
a switchable bias injector coupled to said input node,
wherein (a) when said switchable feedback path is off and said switchable bias injector is on, said amplifier is in a high gain state and (b) when said switchable feedback path is on and said switchable bias injector is off, said amplifier is in a low gain state.

2. The amplifier circuit of claim 1 wherein said switchable feedback path includes a capacitor, a resistor, and a first transistor connected in series between said input node and said output node, said first transistor having a control gate for switching said switchable feedback path on and off.

3. The amplifier circuit of claim 1 wherein said switchable bias injector includes a transistor coupled between a voltage reference and said input node, said transistor having a control gate for switching said switchable bias injector on and off.

4. The amplifier circuit of claim 2 wherein said switchable bias injector includes a second transistor coupled between a voltage reference and said input node, said second transistor having a control gate for switching said switchable bias injector on and off.

5. The amplifier circuit of claim 4 including a control signal coupled to said control gate of each of said transistors, said control signal (a) turning off said first transistor and turning on said second transistor when said amplifier is in said high gain state, and (b) turning on said first transistor and turning off said second transistor when said amplifier is in said low gain state.

6. The amplifier circuit of claim 1 wherein said amplifier, said switchable feedback path, and said switchable bias injector are formed on an integrated circuit.

7. The amplifier circuit of claim 6 further comprising an input matching network and an output matching network formed on said integrated circuit.

8. The amplifier circuit of claim 7 wherein said amplifier has a collector, said amplifier circuit further comprising a Vcc bias injector coupled to said collector of said amplifier for injecting a voltage level at said collector.

9. The amplifier circuit of claim 8 wherein said Vcc bias injector is formed on said integrated circuit.

10. An RF integrated circuit for up converters and down converters comprising:
an RF amplifier having an input node and an output node;
a switchable feedback path coupled between said output node and said input node; and
a switchable bias injector coupled to said input node,
wherein (a) when said switchable feedback path is off and said switchable bias injector is on, said RF amplifier is in a high gain state, and (b) when said switchable feedback path is on and said switchable bias injector is off, said RF amplifier is in a low gain state.

11. The RF integrated circuit of claim 10 wherein said switchable feedback path includes a capacitor, a resistor, and a first transistor connected in series between said input node and said output node, said first transistor having a control gate for switching said switchable feedback path on and off.

12. The RF integrated circuit of claim 10 wherein said switchable bias injector includes a transistor coupled between a voltage reference and said input node, said transistor having a control gate for switching said switchable bias injector on and off.

13. The RF integrated circuit of claim 11 wherein said switchable bias injector includes a second transistor coupled between a voltage reference and said input node, said second transistor having a control gate for switching said switchable bias injector on and off.

14. The RF integrated circuit of claim 13 further comprising a control signal coupled to said control gate of each of said transistors, said control signal (a) turning off said first transistor and turning on said second transistor, when said amplifier is in said high gain state, and (b) turning on said first transistor and turning off said second transistor, when said amplifier is in said low gain state.

15. A gain controlled amplifier circuit fabricated on-chip comprising:

an amplifier having an input node and an output node;

a switchable feedback path coupled between said output node and said input node; and a switchable bias injector coupled to said input node, wherein (a) when said switchable feedback path is off and said switchable bias injector is on, said amplifier is in a high gain state, and (b) when said switchable feedback path is on and said switchable bias injector is off, said amplifier is in a low gain state.

16. The amplifier circuit of claim 15 wherein said switchable feedback path includes a capacitor, a first resistor, and a transistor connected in series between said input node and said output node, said first transistor having a control gate for switching said switchable feedback path on and off.

17. The amplifier circuit of claim 15 wherein said switchable bias injector includes a transistor coupled between a voltage reference and said input node, said transistor having a control gate for switching said switchable bias injector on and off.

18. The amplifier circuit of claim 16 wherein said switchable bias injector includes a second transistor coupled between a voltage reference and said input node, said second transistor having a control gate for switching said switchable bias injector on and off.

19. The amplifier circuit of claim 18 further comprising a control signal coupled to said control gate of each of said transistors, said control signal (a) turning off said first transistor and turning on said second transistor, when said amplifier is in said high gain state, and (b) turning on said first transistor and turning off said second transistor, when said amplifier is in said low gain state.

20. The amplifier circuit of claim 19 wherein said amplifier has a collector, said amplifier circuit further comprising a $V_{cc}$ bias injector coupled to said collector of said amplifier for injecting a voltage level at said collector.

* * * * *